(12) United States Patent
Ko (10) Patent No.: US 7,710,804 B2
(45) Date of Patent: May 4, 2010

(54) AUTO PRECHARGE CIRCUIT SHARING A WRITE AUTO PRECHARGE SIGNAL GENERATING UNIT

(75) Inventor: Han Suk Ko, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 127 days.

(21) Appl. No.: 12/137,040

(22) Filed: Jun. 11, 2008

(65) Prior Publication Data

US 2009/0046527 A1 Feb. 19, 2009

(30) Foreign Application Priority Data

Aug. 14, 2007 (KR) ...................... 10-2007-0081811

(51) Int. Cl.
*G11C 7/00* (2006.01)
(52) U.S. Cl. ..................... 365/203; 365/194; 365/233.1; 365/193; 365/233.19
(58) Field of Classification Search ................. 365/203, 365/194, 233.1, 193, 233.19, 189.14
See application file for complete search history.

(56) References Cited

U.S. PATENT DOCUMENTS 7,336,551 B2 * 2/2008 Bains ......................... 365/203

FOREIGN PATENT DOCUMENTS

KR 1020070036598 A 4/2007

\* cited by examiner

*Primary Examiner*—David Lam
(74) *Attorney, Agent, or Firm*—Ladas & Parry LLP (57) ABSTRACT

In the auto precharge circuit, a plurality of read auto precharge signal generating units and a plurality of auto precharge signal output units share a single write auto precharge signal generating unit. Each read auto precharge signal generating unit logically combines an internal CAS command signal, an internal address signal and a pre auto precharge signal to generate an auto precharge detect signal and a read auto precharge signal. The write auto precharge signal generating unit delays the read auto precharge signal by a predetermined time to generate a write auto precharge signal. Each auto precharge signal output unit logically combines the internal CAS command signal, an internal address signal, a read auto precharge signal, and a write auto precharge signal to output an auto precharge signal.

8 Claims, 7 Drawing Sheets

AUTO PRECHARGE CIRCUIT SHARING A WRITE AUTO PRECHARGE SIGNAL GENERATING UNIT

CROSS-REFERENCE TO RELATED APPLICATIONS

The present application claims priority to Korean patent application number 2007-0081811 filed on Aug. 14, 2007, which is incorporated herein by reference in its entirety.

BACKGROUND OF THE INVENTION

The present invention relates to a semiconductor memory device, and more particularly to a semiconductor memory device capable of reducing the area occupied by an auto precharge circuit.

In a typical semiconductor memory device, the word line is automatically disabled upon completion of a write operation in response to a write command that includes an auto precharge command. The disabling is performed by an auto precharge control circuit included within the semiconductor memory device. When the write command, which includes the auto precharge command, is inputted to the semiconductor memory device, the auto precharge control circuit automatically generates the precharge signal at a predetermined time point after the input operation of the semiconductor memory device is finished. In response to the precharge signal, a row activating unit (or row decoder) disables the word lines belonging to the cells that have finished the write operation.

An auto precharge block is present for each memory bank, and memory bank information is carried in an internal column access strobe command signal (ICAS) that is inputted to the auto precharge block. A time point at which the auto precharge signal is generated depends on whether a signal is a read signal or a write signal. That is, when the signal is a read signal the auto precharge signal is generated just after the read command, whereas when the signal is a write signal the auto precharge signal is generated at variable time points after the write command, since the write recovery time (or tDPL: data in to precharge command; hereinafter, referred to as 'tWR') is required.

The tWR is a period of time ranging from when the data is stored in a unit cell of the memory device until the precharge operation is performed. That is, the tWR is a minimum time period in which data can be sufficiently stored in the active bank without interrupting the precharge command.

Figure 1:
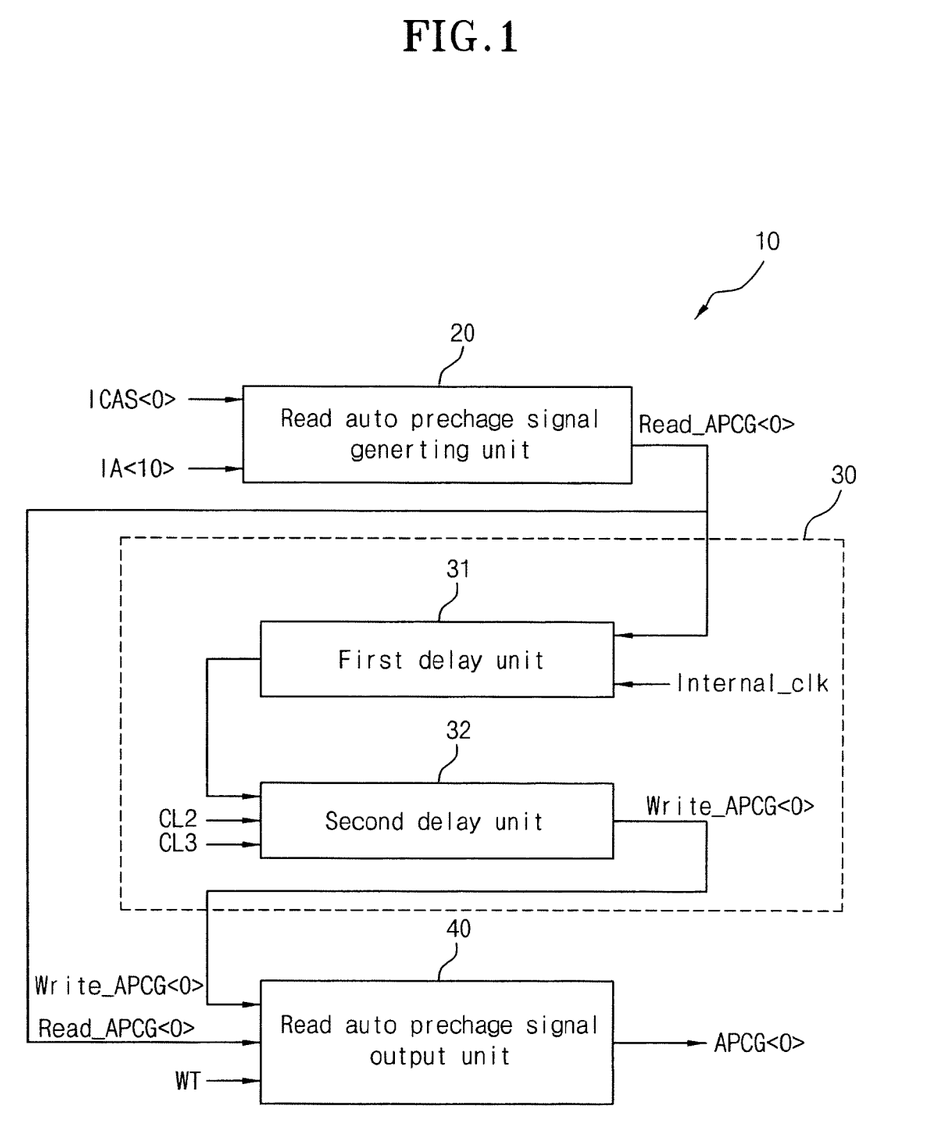
FIG. 1 is a block diagram showing a conventional auto precharge circuit.

In order to secure the tWR, a delay unit is included in the auto precharge block. FIG. 1 shows an embodiment in which a delay unit is included in an auto precharge circuit.

Referring to FIG. 1, the auto precharge circuit 10 includes: a read auto precharge signal generating unit 20, which receives a predetermined predeterminedsignal to generate a read auto precharge signal; a write auto precharge signal generating unit 30, which delays the read auto precharge signal for a predetermined predeterminedtime to generate a write auto precharge signal; and an auto precharge signal output unit 40, which receives the read/write auto precharge signals and outputs an auto precharge signal. The write auto precharge signal generating unit 30 includes a first delay unit 31 shifting the read auto precharge signal such that it is synchronized with the internal clock signal, and a second delay unit 32 that delays the read auto precharge signal for a predetermined predetermined time in accordance with the CAS latency CL.

The read auto precharge signal generating unit 20 receives ICAS<0:3> and IA<10> as inputs. ICAS<0:3> and IA<10> are obtained by converting a CAS command, which consists of an external write or read command, and an address signal address<10>, which determines whether or not the signal is the auto precharge, into internal signals. The internal CAS command ICAS<0:3> includes the bank information contained in the internal signal, and the generated time point varies in accordance with whether the signal is a read or a write signal (shifted 2 clock cycles from the external write signal). Also, the internal address signal IA<10> has its generating time point varied in accordance with whether the signal is a read or a write signal (shifted 2 clock cycles from the external write signal). The above example assumes that the semiconductor device has 4 banks.

Since each memory bank includes an auto precharge circuit 10, when there are 4 banks, four read auto precharge generating units 20, four write auto precharge signal generating units 30, and four auto precharge signal output units 40 are necessary. In a semiconductor device, the circuit area increases as the number of banks increases, and thus cell efficiency decreases.

The block shown in FIG. 1 operates as follows.

In the read auto precharge case, ICAS<0> and IA<10> are generated in response to externally input commands, and ICAS<0> and IA<10> are inputted to the auto precharge signal generating circuit of the designated bank. The read auto precharge signal generating unit 20 holds an auto precharge detect signal APCG_DETB at a low level by a latch operation. The read auto precharge signal Read_APCG<0> of a low level is generated if a burst end signal is received during a burst operation.

It is not necessary to secure the tWR in the read operation, and thus the read auto precharge signal Read_APCG<0> is not inputted to the write auto precharge signal generating unit 30, and is instead directly input to the auto precharge signal output unit 40 where the auto precharge signal APCG<0> is output.

In the write auto precharge case, similar to the read auto precharge, the ICAS<0> and the IA<0> are generated in response to the externally input commands and the signals are then input to the auto precharge signal generating unit 20 of the designated bank. The auto precharge detect signal APCG_DETB maintains the low level by a latch operation, and the read auto precharge signal Read_APCG<0> is generated if the burst end signal is received. However, in the write auto precharge case, the read auto precharge signal Read_APCG<0> must pass through the write auto precharge signal generating unit 30 in order to secure the tWR in the write operation. The write auto precharge signal Write_APCG<0>, which is delayed for tWR through the first and second delay units 31, 32 of the write auto precharge signal generating unit 30 is output from the auto precharge signal generating unit 40 as the auto precharge signal APCG<0>.

The write signal WT is supplied so that only one of the write auto precharge signal and the read auto precharge signal is selected and output.

The write auto precharge signal generating unit 30 shown in FIG. 1 must be formed in each bank even though each write auto precharge signal generating unit 30 has the same structure, resulting in the area of the semiconductor device being unnecessarily large.

SUMMARY OF THE INVENTION

The present invention provides an auto precharge circuit capable of minimizing circuit area by sharing a write auto precharge signal generating unit among auto precharge blocks.

The auto precharge circuit of a semiconductor memory device according to the present invention comprises a plurality of read auto precharge signal generating units, each of which logically combines an internal CAS command signal, an internal address signal and a pre auto precharge signal to generate an auto precharge detect signal and a read auto precharge signal; a write auto precharge signal generating unit which delays any one of the read auto precharge signals by a predetermined time to generate a write auto precharge signal; and a plurality of auto precharge signal output units each of which logically combines the internal CAS command signal, the internal address signal, the read auto precharge signal, and the write auto precharge signal to output an auto precharge signal; wherein the plurality of read auto precharge signal generating units and the auto precharge signal output units share the write auto precharge signal generating unit.

The read auto precharge signal generating unit comprises a first control unit controlling the auto precharge detect signal in accordance with the internal CAS signal; a first latch unit latching the auto precharge detect signal during a delay time of the pre auto precharge signal; a first delay unit delaying the output signal of the latch unit; and a first logical operating unit which logically combines an output signal of the first delay unit with a burst end signal to output the read auto precharge signal.

The write auto precharge signal generating unit comprises a second delay unit delaying the read auto precharge signal for the predetermined time; and a logic unit which logically combines the read auto precharge signal, the auto precharge detect signal, and the signal delayed for the predetermined time to generate the write auto precharge signal.

The logic unit comprises a read auto precharge signal select unit which selects any one of the plurality of read auto precharge signals and outputs the selected auto precharge signal to the second delay unit.

The read auto precharge signal select unit comprises a NAND-operation unit receiving the plurality of read auto precharge signals and an inverter inverting an output signal of the NAND operating unit.

The logic unit comprises a second latch unit receiving the read auto precharge signal and the inverted auto precharge detect signal and generating an enable signal to activate the write auto precharge signal; and a NAND operating unit receiving the enable signal and the signal delayed for the predetermined time via the second delay unit.

The number of the second latch units and the NAND operating units is same as the number of the memory banks in the semiconductor memory device.

The auto precharge signal generating unit comprises a second logical operation unit outputting a write signal when the internal CAS command signal and the internal address signal are activated; a third logical operation unit logically combining the write signal output from the logical operating unit with the read auto precharge signal and the write auto precharge signal to output the pre auto precharge signal; and a fourth logical operation unit which delays the pre auto precharge signal of the second logical operating unit for a predetermined time, such that the auto precharge signal is output upon completion of the auto precharge operation.

In the present invention, it is possible to reduce the total area of a semiconductor device, and thus improve cell efficiency, since multiple banks, each having an auto precharge circuit, share a single write auto precharge signal generating unit.

DESCRIPTION OF SPECIFIC EMBODIMENTS

Hereinafter, preferred embodiments of the present invention will be described in detail with reference to the accompanying drawings.

Figure 2:
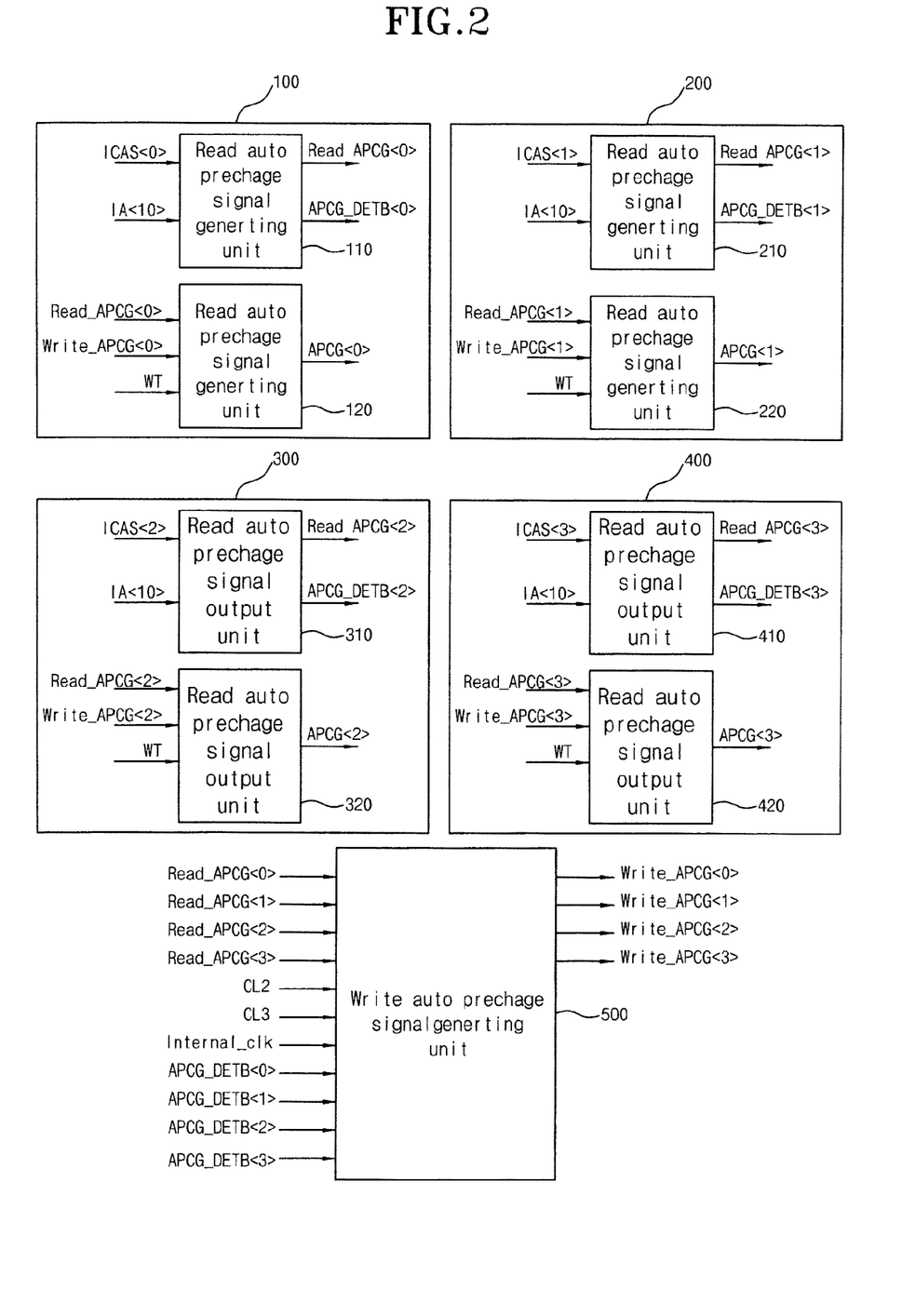
FIG. 2 is a block diagram showing an auto precharge circuit according to an embodiment of the present invention.

FIG. 2 is a block diagram showing an embodiment in which four memory banks, each having an auto precharge control circuit 100, 200, 300, 400, share a single write auto precharge signal generation unit 500.

Each auto precharge control circuit 100, 200, 300, 400 includes a read auto precharge signal generating unit 110, 210, 310, 410 and an auto precharge signal output unit 120, 220, 320, 420.

Each auto precharge circuit 100, 200, 300, 400 shares the write auto precharge signal generating unit 500. The write auto precharge signal generating unit 500 receives read auto precharge signals Read_APCG<0>~<3> and auto precharge detect signals APCG_DETB<0>~<3> from the read auto precharge signal generating units 110, 210, 310, 410; and generates write auto precharge signals Write_APCG<0>~<3> and outputs the signals to the auto precharge signal output units 120, 220, 320, 420.

As shown in FIG. 2, the auto precharge control circuit is contained in each bank, and each auto precharge control circuit is the same; accordingly, only the auto precharge control circuit 100 and the write auto precharge signal generating unit 500 for bank<0> will be explained.

Figure 3:
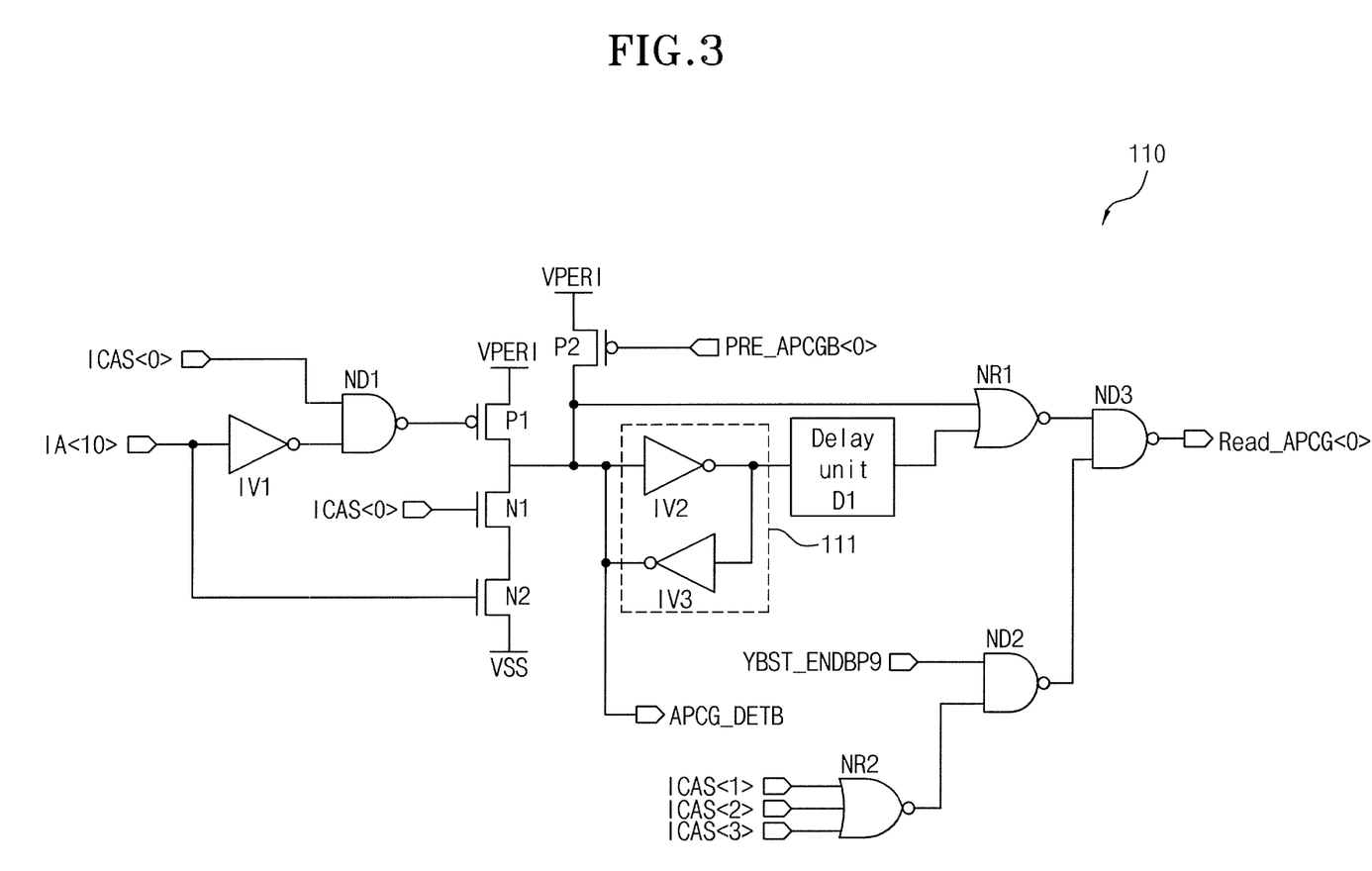
FIG. 3 is a detailed structure diagram of the read auto precharge signal generating unit shown in FIG. 2.
Figure 4:
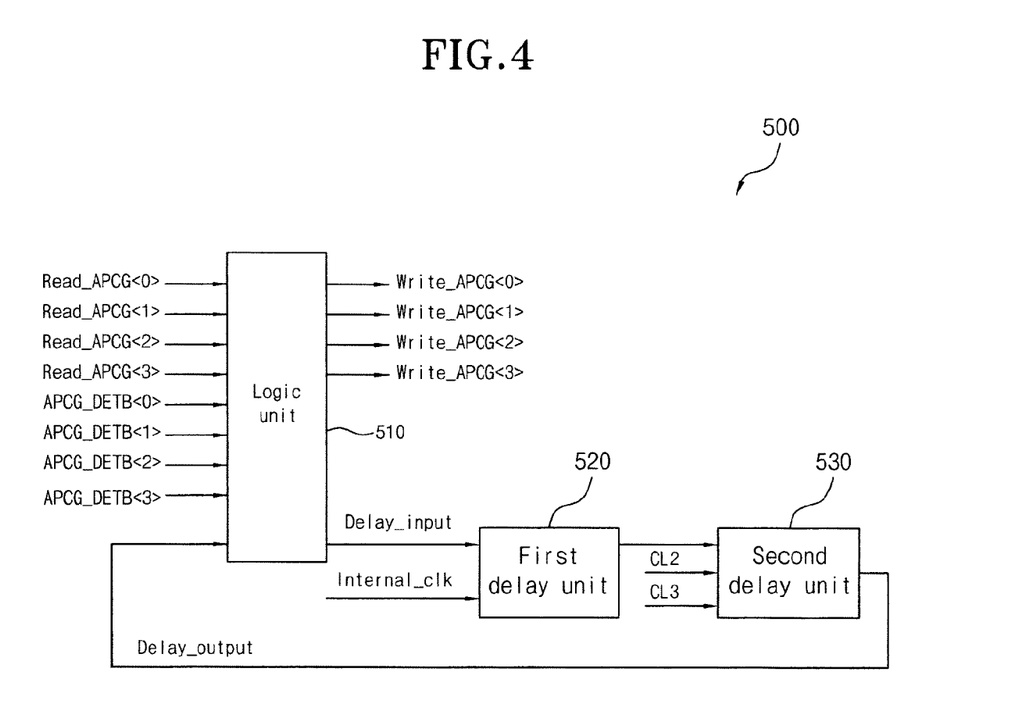
FIG. 4 is a detailed structure diagram of the write auto precharge signal generating unit shown in FIG. 2.
Figure 5:
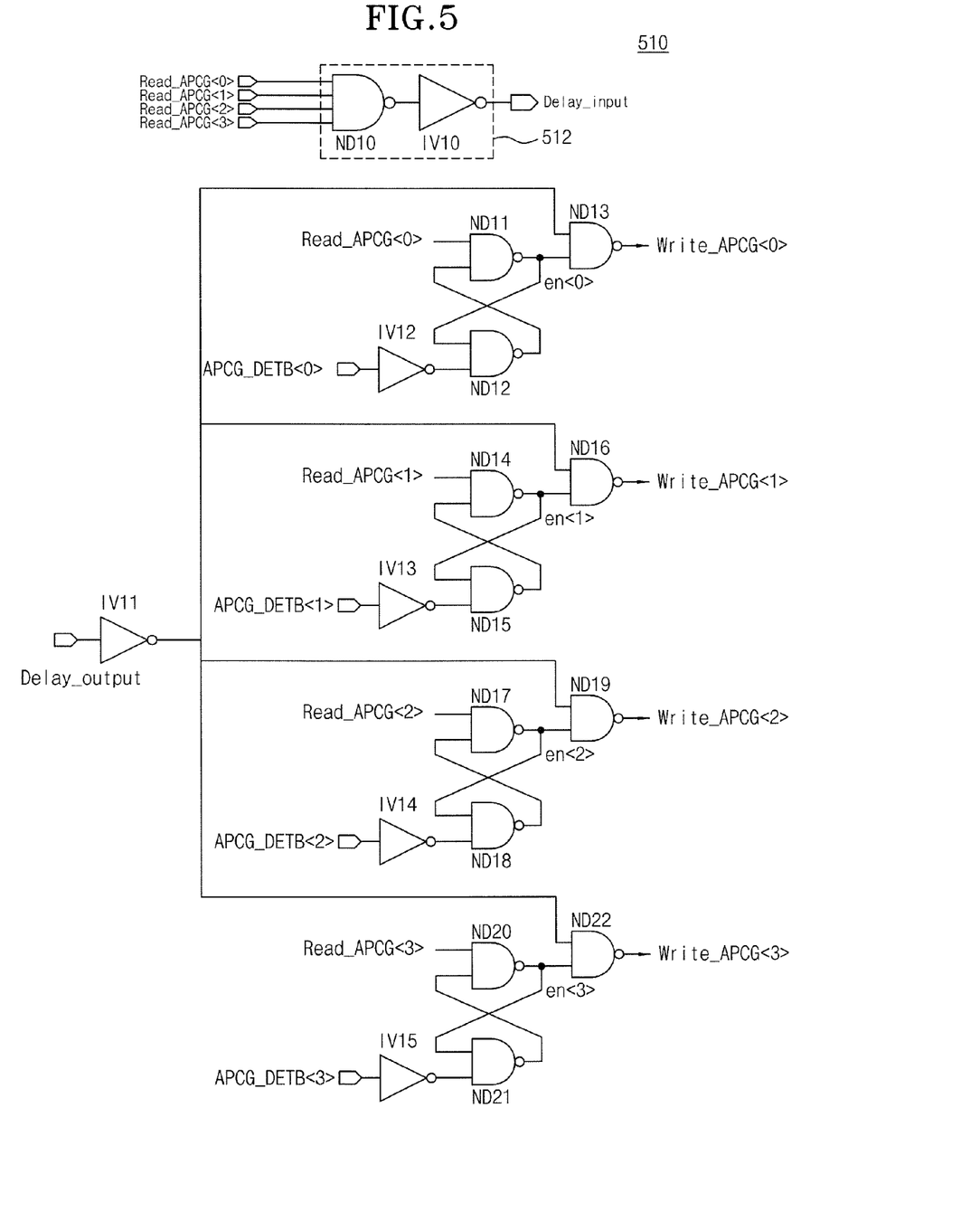
FIG. 5 is a detailed structure of the logic unit shown in FIG. 4.
Figure 6:
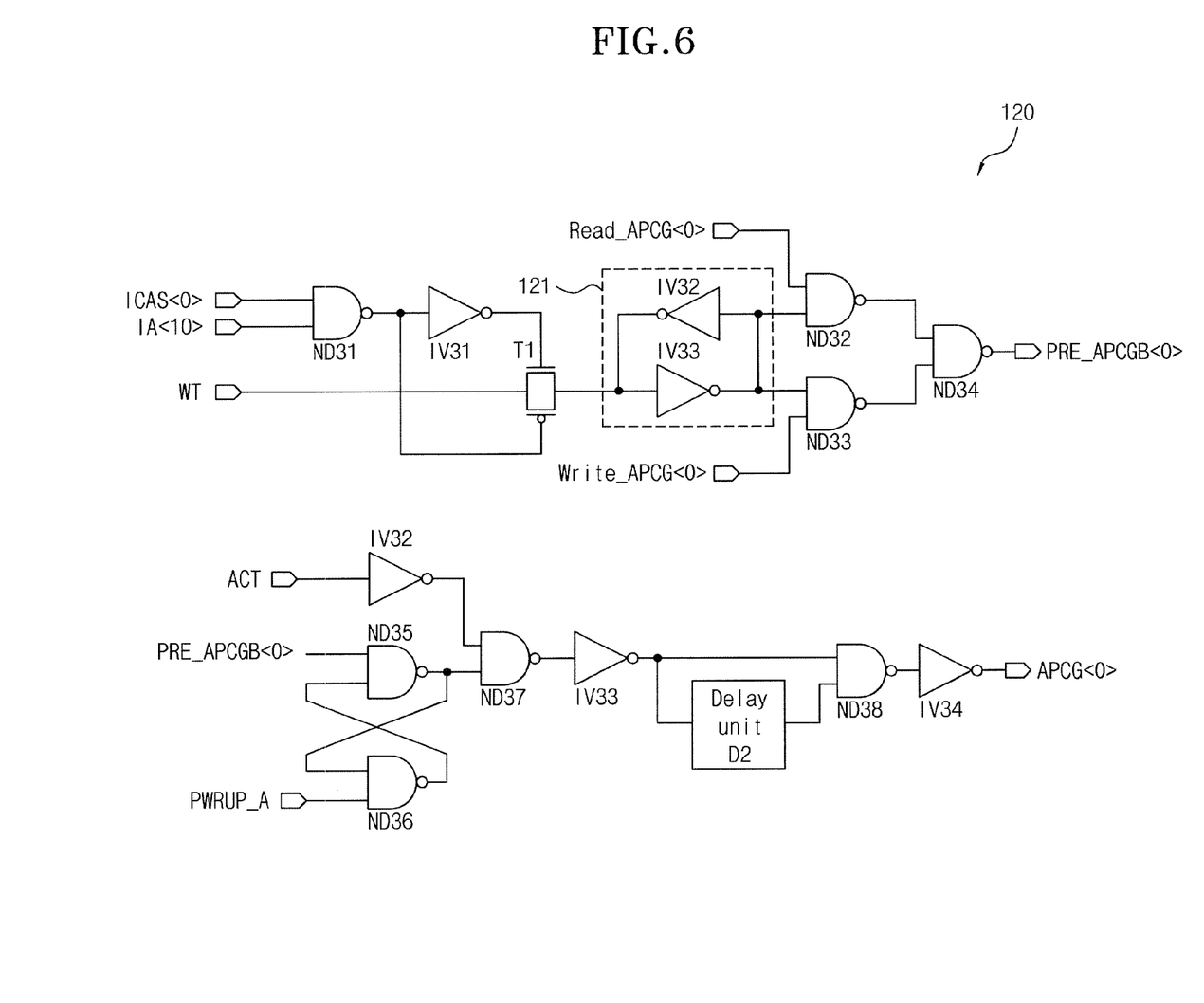
FIG. 6 is a detailed structure diagram of the auto precharge signal output unit shown in FIG. 2.

The detailed structure of the read auto precharge signal generating unit 110 is shown in FIG. 3, the detailed structure of the write auto precharge signal generating unit 500 is shown in FIGS. 4 and 5, and the detailed structure of the auto precharge signal output unit 120 is shown in FIG. 6.

Referring to FIG. 3, the read auto precharge signal generating unit 110 includes a plurality of inverters IV1 to IV3, a plurality of NAND gates ND1 to ND3, a latch circuit 111, a delay unit D1, a plurality of PMOS transistors P1 to P2, and a plurality of NMOS transistors N1 to N2.

The NAND gate ND1 performs a NAND logical operation an auto precharge operation signal IA<0>, which is inverted by the inverter IV1, and a burst operation signal ICAS<0>. The NAND gate ND1 is inputted to a gate terminal of the PMOS transistor P1. The internal CAS command signal ICAS<0> is inputted to the gate terminal of the NMOS transistor N1, and the internal address IA<0> is inputted to a gate terminal of the NMOS transistor N2. The PMOS transistor P2 is turned on or off in response to the pre auto precharge signal PRE_APCGB<0>.

The MOS transistors P1, P2, N1 and N2 are switched in accordance with the input signals described above to output the auto precharge detect signal APCB_DETB. For example, if the internal CAS command signal ICAS<0> and the internal address IA<10> are at a high level, the NMOS transistors N1 and N2 are turned on, and voltage VSS is applied so that the auto precharge detect signal APCB_DETB, which is held at a low level by the latch circuit 111, is output. Therefore, the inverter IV1, the NAND gate ND1, and the MOS transistors P1, N1 and N2 are responsible for controlling the auto precharge detect signal APCG_DETB.

When the PMOS transistor P2 is turned on, the NOR gate NR1 performs a NOR logical operation on the pre auto precharge control signal PRE_APCGB<0> and the signal latched by the latch circuit 111 and delayed by the delay unit D1.

The NAND gate ND2 performs a NAND logical operation on a burst end signal YBST_ENDBP9 and a signal obtained when a NOR logical operation is performed on the internal CAS command signals ICAS<1>, ICAS<2> and ICAS<3>.

The NAND gate ND3 performs a NAND logical operation on the signal output from the NOR gate NR1 and the signal output from the NAND gate ND2 to generate the read auto precharge signal Read_APCG<0>.

The auto precharge detect signal APCG_DETB and the read auto precharge signal Read_APCG, which are generated in the read auto precharge signal generating unit 110, are inputted to the write auto precharge signal generating unit 500.

Referring to FIG. 4, the write auto precharge signal generating unit 500 includes: a logic unit 510, which logically combines auto precharge detect signals APCG_DETB<0>, APCG_DETB<1>, APCG_DETB<2> and APCG_DETB<3> with the corresponding read auto precharge signals Read_APCG<0>, Read_APCG<1>, Read_APCG<2> and Read_APCG<3> to output respective write auto precharge signals Write_APCG<0>, Write_APCG<1>, Write_APCG<2> and Write_APCG<3>; a first delay unit 520, which delays (in accordance with the internal clock) a signal Delay_input selected by the logic unit from the plurality of read auto precharge signals; and a second delay unit 530, which delays the output signal of the first delay unit in accordance with the CAS latency CL. The signal delayed by the second delay unit is inputted back into the logic unit 510.

The detailed structure of the logic unit 510 is shown in FIG. 5.

Referring to FIG. 5, the logic unit 510 includes a plurality of inverters IV10 to IV15 and a plurality of NAND gates ND10 to ND22.

The logic unit 510 includes a select unit 512, which selects any one of the read auto precharge signals Read_APCG<0>, Read_APCG<1>, Read_APCG<2>, Read_APCG<3> that are received from the read auto precharge signal generating units 110, 210, 310, 410. The select unit 512 comprises the NAND gate ND10 and the inverter IV10. The signal Delay_input, which is output via the select unit 512, is outputted as delay signal Delay_output via the first delay unit 520 and the second delay unit 530 and input back into the logic unit 510.

The read precharge signal Read_APCG<0> and the inverted precharge detect signal APCG_DETB<0> are held at a low level by a latch circuit comprising the NAND gates ND11 and ND12. The latch circuit generates an enable single in order to activate the write auto precharge signal. The NAND gate ND13 performs a NAND logical operation on the latch signal having the low level and the delayed signal Delay_output to generate the write auto precharge signal Write APCG<0>.

The signals that are output from other banks are also output as write auto precharge signals Write_APCG<1>, Write_A-PCG<2>. Write_APCG<3> through the same above described procedure.

The write auto precharge signal Write_APCG<0> is in putted to the auto precharge signal output unit 120.

Referring to FIG. 6, the auto precharge signal output unit 120 includes a plurality of inverters IV31 to IV34, a plurality of NAND gates ND31 to ND38, a transmission gate T1, and a delay unit D2.

The NAND gate ND31 performs a NAND logical operation on the internal address signal IA<10> and the internal CAS command signal ICAS<0>, and the inverter 31 inverts the NAND-operated signal. The transmission gate T1 selectively controls the write signal WT in accordance with the signal inverted by the inverter IV31.

The NAND gate ND32 performs a NAND operation on the read auto precharge signal Read_APCG<0> output from the read auto precharge signal generating unit 110 and an output signal from the latch unit 121, which comprises inverters IV32 and IV33. The NAND gate 33 performs a NAND logical operation on the output signal from the latch unit 121 and the write auto precharge signal Write_APCG<0>, which is output from the write auto precharge signal generating unit 500. The NAND gate ND34 performs a NAND logical operation on the output signals from the NAND gates ND32 and ND33 to output the pre auto precharge signal PRE_APCGB<0>.

The NAND gate ND37 performs a NAND logical operation on an active signal ACT inverted by the inverter IV32 and a signal latched by the NAND gates ND35 and ND36. The NAND gate ND38 performs a NAND logical operation on the signal delayed by the delay unit D2 and an inverted output signal of the signal from the NAND gate ND37. The inverter IV34 inverts the signal output from the NAND gate ND38 to generate the auto precharge signal APCG<0>. The power-up signal PWRUP_A, which is inputted to the NAND gate ND36, initiates the circuit.

The control signals mentioned in the drawings will hereinafter be explained.

The internal address signal IA<10> is used for determining whether the auto precharge operation is to be performed or not. This signal is enabled when the write command or the read command (which includes the auto precharge command) is activated.

The internal CAS command signal ICAS is used for informing the circuit of a starting time point of the burst operation in response to the write signal or the read signal, and the internal CAS command signal ICAS is responsible for initiating the circuit such that the circuit operates from the start time point of the burst operation.

The write signal WT is used for discriminating the write operation from the read operation. The write signal WT is at a high level during the write operation and a low level during the read operation. That is, if the auto precharge command is input, only one of the write auto precharge signal and the read auto precharge signal can be selected and output.

The active signal ACT is an active feedback signal output from the bank. The active signal ACT is responsible for synchronization, ensuring that operation stops at the time point at which the precharge operation has ended.

The burst end signal YBST_ENDBP9 is used for informing the circuit of the time point at which the burst operation ends and the auto precharge operation begins.

Figure 7:
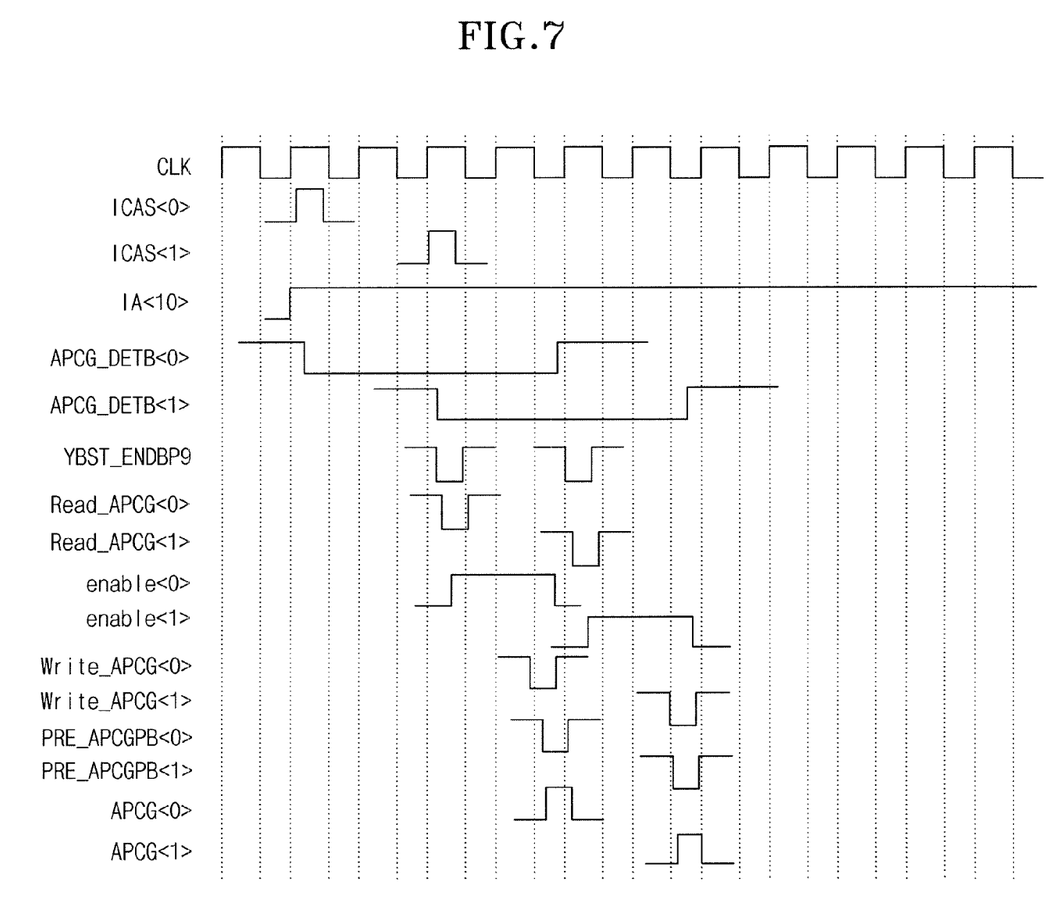
FIG. 7 is a generation timing diagram of the auto precharge signal having the structure shown in FIG. 2

FIG. 7 is an operational timing diagram of the auto precharge control circuit according to the present invention.

As shown in FIG. 7, if the internal CAS command signal ICAS<0> is activated at a high level, the auto precharge detect signal APCB_DETB<0> is generated using the signal held at a low level by the latch circuit. When the burst end signal YBST_ENDBP9 is input at a low level, the read auto precharge signal Read_APCG<0> is generated at a low level.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An auto precharge circuit of a semiconductor memory device, comprising:

a plurality of read auto precharge signal generating units, each of which logically combines an internal column access strobe (CAS) command signal, an internal address signal, and a pre auto precharge signal to generate an auto precharge detect signal and a read auto precharge signal;

a write auto precharge signal generating unit which delays any one of the read auto precharge signals by a predetermined time to generate a write auto precharge signal; and a plurality of auto precharge signal output units each of which logically combines the respective one of the internal CAS command signal, the internal address signal, the read auto precharge signal, and the write auto precharge signal to output an auto precharge signal, wherein the plurality of read auto precharge signal generating units and auto precharge signal output units share the write auto precharge signal generating unit.

2. The auto precharge circuit of claim 1, wherein the read auto precharge signal generating unit comprises:

a first control unit controlling the auto precharge detect signal in accordance with the internal CAS signal;

a first latch unit latching the auto precharge detect signal during a delay time of the pre auto precharge signal;

a first delay unit delaying an output signal of the latch unit; and a first logical operating unit logically combining the output signal of the first delay unit with a burst end signal to output the read auto precharge signal.

3. The auto precharge circuit of claim 1, wherein the write auto precharge signal generating unit comprises:

a second delay unit delaying the read auto precharge signal for the predetermined time; and a logic unit logically combining the read auto precharge signal, the auto precharge detect signal, and the signal delayed for the predetermined time to generate the write auto precharge signal.

4. The auto precharge circuit of claim 3, wherein the logic unit comprises a read auto precharge signal select unit which selects any one of the plurality of read auto precharge signals and outputs the selected read auto precharge signal to the second delay unit.

5. The auto precharge circuit of claim 4, wherein the read auto precharge signal select unit comprises a NAND-operation unit receiving the plurality of read auto precharge signals and an inverter inverting an output signal of the NAND operating unit.

6. The auto precharge circuit of claim 3, wherein the logic unit comprises:

a second latch unit receiving the read auto precharge signal and an inverted auto precharge detect signal and generating an enable signal to activate the write auto precharge signal; and a NAND operating unit receiving the enable signal and the signal delayed for the predetermined time via the second delay unit.

7. The auto precharge circuit of claim 6, wherein the number of the second latch units and the NAND operating units is same as the number of memory banks in the semiconductor memory device.

8. The auto precharge circuit of claim 1, wherein the auto precharge signal generating unit comprises:

a second logical operation unit outputting a write signal when the internal CAS command signal and the internal address signal are activated;

a third logical operation unit logically combining the write signal output from the second logical operating unit with the read auto precharge signal and the write auto precharge signal to output the pre auto precharge signal; and a fourth logical operation unit which delays the pre auto precharge signal of the second logical operating unit for a predetermined time, such that the auto precharge signal is output upon completion of the auto precharge operation.

* * * * *